(12) United States Patent
Mathur et al.

(10) Patent No.: US 10,134,728 B2
(45) Date of Patent: Nov. 20, 2018

(54) ESD CENTRIC LOW-COST IO LAYOUT DESIGN TOPOLOGY

(71) Applicant: SanDisk Technologies Inc., Plano, TX (US)

(72) Inventors: Shiv Harit Mathur, Bangalore (IN); Anand Sharma, Karnataka (IN); Lakhdar Iguelmamene, San Jose, CA (US); Richard J K Hong, Cupertino, CA (US); Rajeswara Rao Bandaru, Bangalore (IN)

(73) Assignee: SanDisk Technologies LLC, Plano, TX (US)

( * ) Notice: Subject to any disclaimer, the term of this patent is extended or adjusted under 35 U.S.C. 154(b) by 138 days.

(21) Appl. No.: 15/087,004

(22) Filed: Mar. 31, 2016

(65) Prior Publication Data

US 2017/0213817 A1    Jul. 27, 2017

(30) Foreign Application Priority Data

Jan. 22, 2016    (IN) .............................. 201641002395

(51) Int. Cl.
*H01L 27/06* (2006.01)
*H01L 27/02* (2006.01)

(52) U.S. Cl.
CPC ...... *H01L 27/0629* (2013.01); *H01L 27/0292* (2013.01)

(58) Field of Classification Search
CPC ........................ H01L 27/0629; H01L 27/0292
See application file for complete search history.

(56) References Cited

U.S. PATENT DOCUMENTS

| 7,514,292 B2 | 4/2009 | Efland et al. |
| 2007/0111376 A1* | 5/2007 | Pendse .................... H01L 24/06 438/106 |
| 2010/0165522 A1* | 7/2010 | Stockinger .......... G06F 17/5068 361/56 |

* cited by examiner

*Primary Examiner* — Marc Armand
(74) *Attorney, Agent, or Firm* — Brinks Gilson & Lione

(57) ABSTRACT

An integrated circuit may include a plurality of input/output (I/O) cells used for communicating signals, power, and ground to and from a core of the integrated circuit. The I/O cells may each include a bond pad formed in one or more top metal layers. One or more of the bond pads may be offset a predetermined distance from an I/O cell edge corresponding to a chip edge of the integrated circuit. A volume may be determined by the I/O cell edge and the predetermined distance and one or more rails may be disposed in the volume and in at least one metal layer common with at least one metal layer of the bond pad. The rails may be involved in the discharge of electrostatic discharge (ESD) current, and may reduce path resistance of the path used to discharge the ESD current.

18 Claims, 4 Drawing Sheets

ESD CENTRIC LOW-COST IO LAYOUT DESIGN TOPOLOGY

BACKGROUND

Integrated circuits include metal connections that interconnect transistors and other circuit components of the integrated circuit. The metal connections are also used to provide the supply and ground reference voltages for the integrated circuit. The metal connections may be formed in multiple metal layers separated or isolated by dielectric layers. The multiple layers may be referred to as a metal stack. Metal connections in different layers may be interconnected to each other as desired using vertical interconnections or vias.

Integrated circuits may be subject to electrostatic discharge (ESD) events, which may involve a sudden flow of electricity between two electrically charged objects caused by contact, or an electrical short. When an ESD event occurs, an accumulation of charge from the sudden flow of electricity may generate an ESD voltage that may peak at a relatively high level, which may cause damage to electronic circuits. Integrated circuits may include ESD protection circuitry to protect against the harmful effects of ESD events. In order to do so, metal connections used for the ESD protection circuitry may be designed to discharge a sufficient amount of current generated from the ESD event in order to suppress the ESD voltage.

Reducing the production cost of a product in which an integrated circuit is implemented is often desirable. Two ways that the production cost may be reduced are reducing the area or size of the die on which the integrated circuit is formed and reducing the number of metal layers of the metal stack. However, reducing the number of metal layers may be undesirable from an ESD perspective because doing so reduces the number of metal layers available for use in discharging the current, thereby reducing the effectiveness of the ESD protection circuitry. Put another way, for a given integrated circuit configuration with a given number of metal layers, increasing the total number of metal layers of the metal stack in order to make available more metal layers for discharging ESD current may be cost prohibitive. As such, an integrated circuit configuration that increases the number of metal layers used in discharging ESD current without increasing the total number of metal layers in the metal stack may be desirable.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION OF PRESENTLY PREFERRED EMBODIMENTS

Overview

Figure 2:
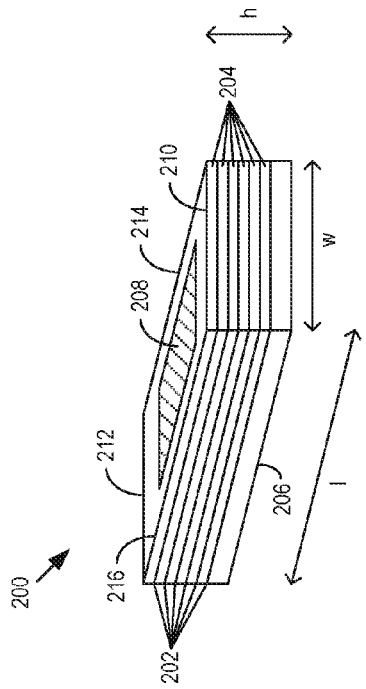
FIG. 2 is a perspective view of an example input/output (I/O) cell, showing multiple metal layers of the I/O cell.

As mentioned in the background section, reducing or limiting the number of metal layers available for electrostatic discharge (ESD) may reduce or limit the performance of ESD protection circuitry. The following embodiments describe an example integrated circuit with a bond pad offset from an input/output (I/O) cell edge by a predetermined distance, which may create space to allow for an increase in a number of available metal layers for discharging ESD current without increasing a total number of metal layers of the metal stack. In a first embodiment, an integrated circuit includes an input/output (I/O) cell comprising: an I/O cell edge defining a boundary of the I/O cell, and a bond pad offset from the I/O cell edge by a predetermined distance.

In a second embodiment, an integrated circuit includes a first bond pad, a second bond pad, and an electrostatic discharge (ESD) path extending from the first bond pad to the second bond pad. At least one of the first bond pad or the second bond pad is offset from an input/output (I/O) cell edge by a predetermined distance.

In a third embodiment, an integrated circuit includes an input/output (I/O) cell that includes a bond pad and a volume vertically extending a height of the I/O cell. The volume includes electrostatic discharge (ESD) circuitry but not functional circuitry of the I/O cell, and a rail disposed in a same metal layer as the bond pad.

In some embodiments, the I/O cell includes a volume defined by the I/O cell edge and the predetermined distance that the bond pad is offset from the I/O cell edge, and a rail disposed in the volume and in a same metal layer as the bond pad.

In some embodiments, an electrostatic discharge (ESD) diode is disposed in the volume.

In some embodiments, the rail is a first rail, and the I/O cell includes a second rail disposed in the volume and disposed in a different metal layer than the first rail, the different metal layer being in between the ESD diode and the first rail.

In some embodiments, the rail includes a first rail, and the I/O cell includes a second rail disposed in the volume and also in a same metal layer as the bond pad.

In some embodiments, the first rail is a power rail and the second rail is a ground rail.

In some embodiments, the bond pad includes a bond pad edge corresponding to the I/O cell edge, and the predetermined distance is a distance from the I/O cell edge to the bond pad edge.

In some embodiments, the predetermined distance is in a range from 1 micrometer to 18 micrometers.

Other embodiments are possible, and each of the embodiments can be used alone or together in combination. Accordingly, various embodiments will now be described with reference to the attached drawings.

Exemplary Embodiments

As mentioned in the background section, reducing or limiting the number of metal layers available for electrostatic discharge (ESD) may reduce or limit the performance of ESD protection circuitry. The following embodiments describe an example integrated circuit that increases a number of available metal layers for discharging ESD current without increasing a total number of metal layers of the metal stack. The example integrated circuit does so by offsetting one or more bond pads a predetermined distance from an input/output (I/O) cell edge.

Figure 1:
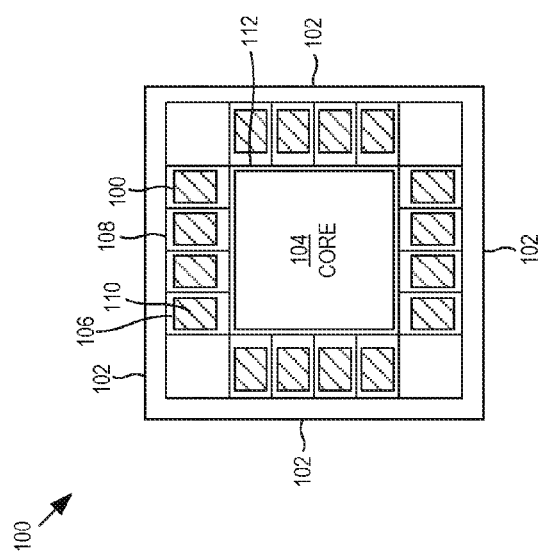
FIG. 1 is a top view of an example integrated circuit.

FIG. 1 is a top view of an example integrated circuit (IC) 100 that may include one or more bond pads offset from an I/O cell edge. The integrated circuit 100 may include IC or chip edges 102 that define an outer boundary of the integrated circuit 100. The integrated circuit 100 may also include a core 104, which may include digital logic circuitry or other similar circuitry, and be configured to perform various functions of the integrated circuit 100. For example, in memory applications, the core 104 may be configured to perform memory management functions, such as execute host read and write commands for example.

In addition, the integrated circuit 100 may include I/O cells 106 for communication between the core 104 and electronic devices external the integrated circuit 100. Each of the I/O cells 106 may be of one of three I/O cell types: a signal I/O cell, a power I/O cell, or a ground I/O cell. A signal I/O cell may be configured to communicate signals carrying data or other information to and from the core 104. As non-limiting examples, for memory applications, the signals may carry data that a host device wants read from or written to memory, or command information associated with the reading or writing of data. A power I/O cell may supply a supply voltage to the core 104 and/or circuit components of the I/O cells 106. A ground I/O cell may provide a ground reference voltage for the core 104 and/or the circuit components of the I/O cells 106. For simplicity, and unless otherwise specified, a power I/O cell and a ground I/O cell are collectively referred to as a power/ground I/O cell.

Each I/O cell 106 may include a bond pad 108 that is configured to provide the connection for the signal, supply voltage, or ground reference voltage between the circuit components of the I/O cell 106 and the contact pins or other connection points of the packaging of the integrated circuit 100 (not shown). In some configurations, wire bonding may be used to connect the bond pad 108 to the contact pins or other connection points of the packaging. The bond pads 108 are described in further detail below.

In addition, each of the I/O cells 106 may include an I/O cell edge 110 corresponding to the chip edge 102 that defines an outer boundary of the I/O cell 106. The I/O cell edge 110 may extend parallel with the chip edge 102 and be the one of the I/O edges of the I/O cell 106 that is closest or nearest to the chip edge 102. In some example configurations, the I/O cell edge 110 may be aligned or flush with the chip edge 102. In other example configurations, such as shown in FIG. 1, the chip edge 102 may extend beyond the I/O cell edge 110 such that there is a spacing or gap in between the chip edge 102 and the I/O cell edge 110. Although not shown, for configurations that include a spacing or a gap, circuit components of the integrated circuit 100 not considered part of the I/O cells 106, such as a decoupling capacitor, may be disposed in the gap or spacing in between the I/O edge 110 and the chip edge 102.

Additionally, each of the I/O cells 106 may include an opposing I/O cell edge or boundary 112 that is opposite and extends generally parallel with the I/O cell edge 110. The opposing I/O cell edge 112 may define an inner boundary of the I/O cell 106 and correspond to the core 104. That is, of the I/O cell edge 110 and the opposing I/O cell edge 112, the I/O cell edge 110 may be closer to the chip edge 102 whereas the opposing I/O cell edge 112 may be closer to the core 104.

Although not shown, in some example configurations, power and ground metal connections may extend around the core 104 in between the outer boundary of the core 104 and the opposing I/O cell edge 112.

In some example configurations, as shown in FIG. 1, the I/O cells 106 may be adjacent to each other and form a ring, which may be referred to as an I/O pad ring, around the core 104. I/O cell topologies other than that shown in FIG. 1 may be possible, including those in which the I/O cells 106 are not adjacent to each other and/or do not form a complete ring around the core 104.

FIG. 2 shows a perspective view of an I/O cell 200, which may be representative of one of the I/O cells 106 of the integrated circuit 100 of FIG. 1. For purposes of the present description, the I/O cell 200 may be a three-dimensional structure, such as a rectangular prism, having a length 1, a width w, and a height h. The length 1 may extend from an I/O cell edge 210 corresponding to the chip edge and an opposing I/O cell edge 212 corresponding to the core. The width w may be defined by outer lateral edges 214, 216, which identify or demarcate the boundaries between adjacent I/O cells. The height h may extend from a base or substrate portion 206 of the I/O cell 200 to a top metal (or other) layer of the I/O cell 200.

The I/O cell 200 may include a plurality of metal layers 202 separated or isolated by dielectric layers 204. The metal layers 202 may be generally planar structures that are aligned with and oriented parallel to each other. The further away from the base or substrate portion 206 of the I/O cell 200 a metal layer is, the higher that metal layer is considered or identified. For example, if an I/O cell 200 has N metal layers, then the Nth layer is the top layer furthest away from the base 206. Also, the metal layers 202 may generally extend uniformly across the different I/O cells of the integrated circuit, such that each of the I/O cells have the same number of metal layers, and the ith metal layer of one I/O cell is co-planar with the ith metal layer of another I/O cell.

Metal connections that interconnect circuit components of the I/O cell 200 or provide supply or ground reference voltages to circuit components of the I/O cell 200 may be formed in the metal layers 202. In addition, metal connections in different layers may be connected to each other with vias. A metal connection in a metal layer may be considered to extend laterally and/or be referred to as a lateral metal connection if it extends generally parallel with the width w of the I/O cell 200, from one lateral I/O cell edge 214 to the other lateral I/O cell edge 216. A metal connection in a metal layer may be considered to extend vertically and/or be referred to as a vertical metal connection if it extends generally parallel with the length l of the I/O cell 200, from the I/O cell edge 210 to the opposing I/O cell edge 212. Also, a metal connection that provides a supply voltage may be referred to as a supply or power rail, and a metal connection that provides a ground reference voltage may be referred to as a ground rail. Hereafter, for simplicity and unless otherwise specified, supply or power rails and ground rails are referred to collectively as "rails," where the term "rail" may refer to either a supply rail or a ground rail.

In addition, a bond pad 208 of the I/O cell 200 may be disposed in a top M-number of the metal layers 202, where M is one or more. That is, assuming that the I/O cell 200 includes N metal layers, the metal layers of the bond pad 208 may include the top or Nth metal layer. In addition, for some example configurations, the metal layers of the bond pad 208 may also include one or more other metal layers directly below the top metal layer. To illustrate, for a seven layer metal stack, the bond pad 208 may be disposed in the seventh (top) layer, as well as one or more other layers directly below the seventh, such as the sixth metal layer or the fifth and sixth metal layers, for example. The bond pad 208 may be configured to include multiple metal layers in order to increase its thickness for withstanding mechanical stress experienced when being subjected to wire bonding and/or probing.

Figure 3:
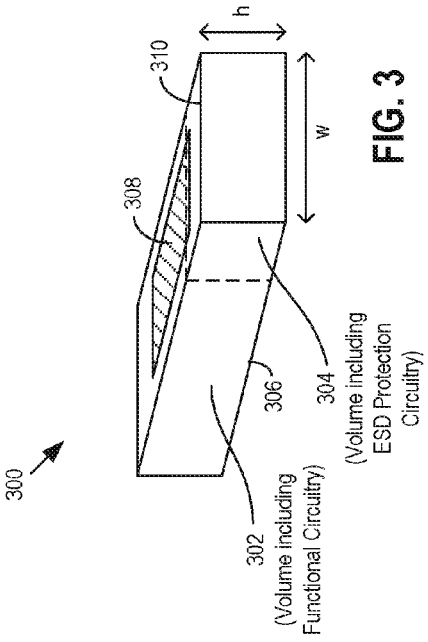
FIG. 3 is another perspective view of an example I/O cell, showing different volumes of the I/O cell where functional and electrostatic discharge (ESD) protection circuitries are located.

FIG. 3 shows a perspective view of a signal I/O cell 300, which may be representative of a signal I/O cell of the integrated circuit of FIG. 1. Although not shown for clarity, the signal I/O cell 300 may also include the plurality of metal layers 202 as shown and described with reference to FIG. 2. FIG. 3 shows the I/O cell 300 as including a bond pad 308, which may be disposed in a top M-number of metal layers of the I/O cell 300.

The signal I/O cell 300 may include two separate volumes 302, 304, each extending a height h of the I/O cell 300 from a base or substrate 306 to a top layer of the I/O cell 300 and a width w of the I/O cell 300. The first volume 302 may include or have disposed therein functional circuitry of the I/O cell 300. Example functional circuitry may include circuitry that is used to communicate a signal between the core 104 and the bond pad 308. Example functional circuitry may include: driver and pre-driver circuitry configured to increase or decrease the drive current of the signal for capacitive load purposes and level shifter circuitry configured to up-shift or down-shift the voltage of the signal between voltage domains, such as a voltage domain in which the core 104 operates and a voltage domain in which signals are communicated between the integrated circuit 100 and an external (host) device. Other functional circuitry may also be included. The second volume 304 may include electrostatic discharge (ESD) protection circuitry used to discharge current generated from an ESD event in order to suppress an ESD voltage.

An I/O edge 310 corresponding to the chip edge of the integrated circuit may be an outer boundary of the second volume 304. That is, length wise, the ESD protection circuitry may be disposed in the signal I/O cell 300 closer to the chip edge than the functional circuitry, while the functional circuitry may be disposed in the I/O cell 300 closer to the core 104 than the ESD protection circuitry. The bond pad 308 may be disposed above the functional circuitry in the first volume 302 and/or the ESD protection circuitry disposed in the second volume 304. A configuration in which the bond pad 308 is disposed over active circuitry in the first volume 302 and/or the second volume 304 may be referred to as a bond-over-active (BOA) configuration, which may be employed to save silicon area.

A power/ground I/O cell may be similar to the signal I/O cell, such as the one shown in FIG. 3, in that its ESD protection circuitry may be disposed in a volume closest to the chip edge. However, a power/ground I/O cell may not include functional circuitry for communication of a signal.

Figure 4:
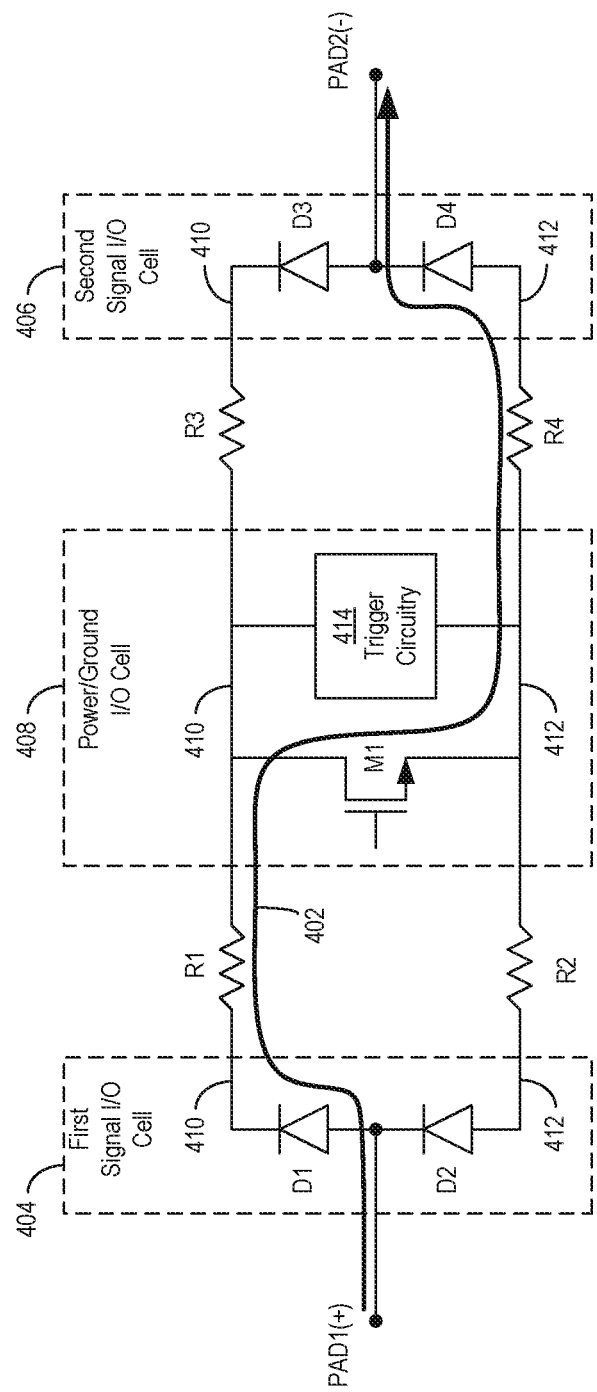
FIG. 4 is a circuit schematic of example ESD protection circuitry used to discharge current in response to an ESD event.

FIG. 4 shows a circuit schematic of example ESD protection circuitry used to discharge current in response to an ESD event. The ESD event may occur on a first bond pad of a first signal I/O cell, denoted as PAD1(+) in FIG. 4. The ESD protection circuitry is configured such that charge accumulated on the first bond pad PAD1(+) is discharged to a second bond pad of a second signal I/O cell, denoted as PAD2(−) in FIG. 4. The plus sign "+" and minus sign "−" are used to denote that when the ESD event occurs, the voltage on the first bond pad PAD1(+) (also referred to as a zap node) is positive with respect to the voltage on the second bond pad PAD2(−) (also referred to as a reference node).

In order to discharge current resulting from the ESD event, a discharge path denoted by arrow 402, may be created through ESD protection circuitry disposed in three I/O cells, including a first signal I/O cell 404 that includes the first bond pad PAD1(+) on which the ESD event occurred, a second signal I/O cell 406 that includes the second bond pad PAD2(−) to which the ESD current is discharged, and a power/ground I/O cell 408.

The ESD protection circuitry included in signal I/O cells may include two ESD diodes, which may be p-n diodes. One of the two ESD diodes may have its anode end connected to the bond pad and its cathode end connected to a power rail 410. The other ESD diode may have its cathode end connected to the bond pad and its anode end connected to a ground rail 412. Accordingly, as shown in FIG. 4, the ESD protection circuitry of the first signal I/O cell 404 may include a first diode D1 with its anode connected to the first bond pad PAD1(+) and its cathode connected to the power rail 410, and a second diode D2 with its cathode end connected to the first bond pad PAD1(+) and its anode end connected to the ground rail 412. Similarly, the ESD protection circuitry of the second signal I/O cell 406 may include a third diode D3 with its anode connected to the second bond pad PAD2(−) and its cathode connected to the power rail 410, and a fourth diode D4 with its cathode end connected to the second bond pad PAD2(−) and its anode end connected to the ground rail 412.

The ESD protection circuitry of the power/ground I/O cell 408 may include a clamp transistor M1 that clamps the power rail 410 to the ground rail 412 so that the ESD current may discharge from the power rail 410 to the ground rail 412 when an ESD event occurs. That is, when an ESD event occurs, the clamp transistor M1 may turn on, allowing the ESD current to flow from the power rail 410 to the ground rail 412 via the clamp transistor M1. The ESD protection circuitry of the power/ground I/O cell 408 may also include trigger circuitry 414, which may be configured to detect the ESD event and turn on the clamp transistor M1 in response to the detection. Example circuit components for the trigger circuitry 414 may include resistor-capacitor (RC) circuitry. A diode connected in parallel with the clamp transistor M1 may also be included in the trigger circuitry 414. Other or additional circuitry used for the trigger circuitry 414 to turn on and off the clamp transistor M1 may be possible.

Physically, the power rail 410 and the ground rail 412 may each include one or more lateral metal connections in one or more metal layers. Where multiple lateral connections in multiple metal layers are used, the power rail 410 and/or ground rail 412 may include one or more vias to connect the multiple lateral connections in the multiple layers. As described in further detail below, one or both of the power rail 410 or the ground rail 412 may include a lateral connection disposed in a layer that is the same as or coplanar with a metal layer of a bond pad included in an ESD discharge path.

Additionally, the power rail 410 and the ground rail 412 may each include rail resistance in between the ESD protection circuitry of the first and second signal I/O cells 404, 406 and the ESD circuitry of the power/ground I/O cell 408. In particular, a portion of the power rail 410 in between the cathode end of first ESD diode D1 and the ESD circuitry of the power/ground I/O cell 408 connected to the power rail 410 may include a first rail resistance represented by a first resistor R1; a portion of the ground rail 412 in between the anode end of second ESD diode D2 and the ESD circuitry of the power/ground I/O cell 408 connected to the ground rail 412 may include a second rail resistance represented by a second resistor R2; a portion of the power rail 410 in between the cathode end of third ESD diode D3 and the ESD circuitry of the power/ground I/O cell 408 connected to the power rail 410 may include a third rail resistance represented by a third resistor R3; and a portion of the ground rail 412 in between the anode end of fourth ESD diode D4 and the ESD circuitry of the power/ground I/O cell 408 connected to the ground rail 412 may include a fourth rail resistance represented by a fourth resistor R4.

When the ESD event occurs on the first bond pad PAD1 (+), the first ESD diode D1 may become forward biased and ESD current generated from the ESD event may flow through the first ESD diode D1 to the power rail 410. The ESD current may continue to flow along the portion of the power rail 410 in between the first ESD diode D1 and the clamp transistor M1. The trigger circuitry 414, having detected the ESD event, may turn on the clamp transistor M1, and so the ESD current may then flow through the clamp transistor M1 to the ground rail 412. The fourth ESD diode D4 may also be forward biased in response to the ESD event, and the PSI) current may flow along the portion of the ground rail 412 in between the clamp transistor M1 and the fourth ESD diode D4, through the fourth ESD diode D4, to the second bond pad PAD2(−), where the ESD current is discharged.

The amount of ESD current that the ESD protection circuitry can discharge may depend on the rail resistance of the ground and power rails—the less resistance, the more current that can be discharged through the discharge path 402. In addition, the amount of rail resistance may depend on the number of lateral metal connections or rails that are connected in parallel. For example, the more lateral metal connections of the portion of the power rail 410 between the first ESD diode D1 and the ESD circuitry of the power/ground I/O cell 408 that are connected in parallel, the lower the rail resistance R1 for that portion. Accordingly, the more metal layers that are available for forming parallelly connected metal connections, the more metal rails that may be connected in parallel to lower the rail resistance. Further, for some example configurations, the lateral rails in higher metal layers may have lower resistivity, such as on the order of 6-7 times lower resistivity, than lateral rails disposed in lower metal layers, further contributing to the desire to use lateral rails in higher metal layers to lower or minimize the rail the resistance.

In addition, during an ESD event, the large majority of the ESD current, such as on the order of 80%, may flow through lateral rails that are close or nearby the ESD protection circuitry. Lateral rails that are close or nearby may be those lateral rails disposed in metal layers above the ESD protection circuitry and that are further disposed in the volume that includes the ESD protection circuitry. That is, lateral rails disposed in metal layers above the ESD circuitry but that are disposed in the volume that includes the functional circuitry may contribute very little to the discharge of the ESD current. As such, in order to minimize lateral rail resistance, it may be desirable to form lateral rails in as many metal layers above the ESD protection circuitry and close to or nearby the ESD protection circuitry, such as in the volume of the I/O cell that includes the ESD protection circuitry, as possible.

For BOA configurations where the bond pad is positioned as close to the chip edge as possible, the bond pad may extend all the way to the I/O cell edge closest to the chip edge, thereby covering most if not all of the ESD circuitry. Since the bond pad may include multiple metal layers, the number of metal layers available for lateral rails in the volume that includes the ESD protection circuitry may be limited due to the positioning of the bond pad, which in turn may limit the number of lateral rails that may be formed to be involved in the discharge of ESD current. The resulting rail resistance may not be as low as optimally desired, resulting in an ESD performance of the ESD protection circuitry that is less than optimal. One way to increase the performance of the ESD protection circuitry is to increase the total number of metal layers included in the metal stack. However, such an approach may be prohibitive both in terms of a resulting production cost increase and an overall increase in size.

Another way to increase ESD performance of the ESD protection circuitry, one that does so but without increasing the total number of layers in the metal stack, is to offset the position of the bond pad a predetermined distance away from the I/O cell edge. Doing so may create space for lateral rails to be disposed in the volume that includes the ESD protection circuitry where the bond pad may otherwise be disposed.

Figure 5:
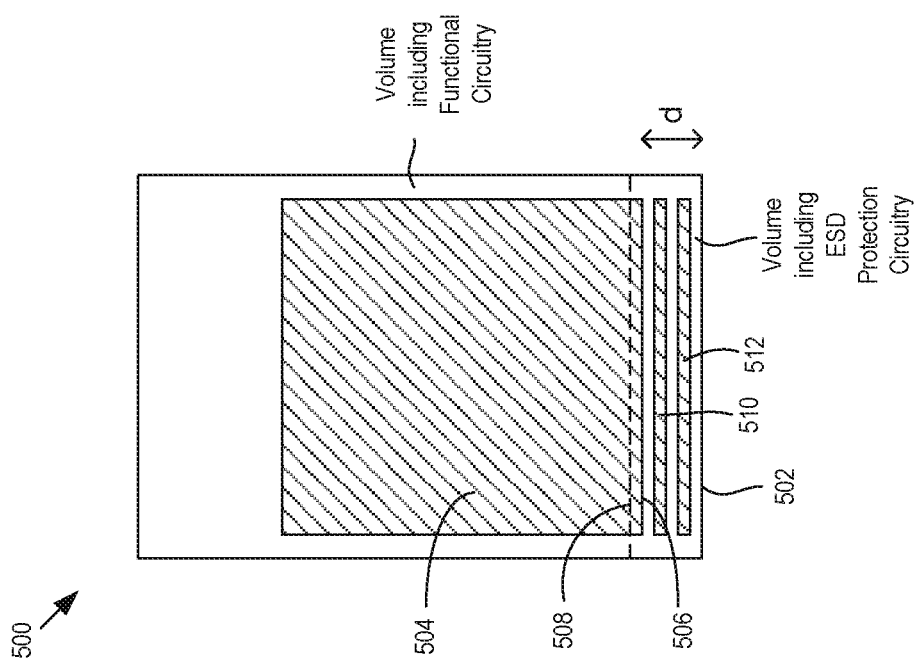
FIG. 5 is a top view of an I/O cell, with a bond pad offset from an I/O cell edge by a predetermined distance.

FIG. 5 shows a top view of an I/O cell 500, which may be representative of any of the I/O cells 106, 200, 300 shown in FIGS. 1-3. The I/O cell 500 may include an I/O cell edge 502 parallel with and closest to a chip edge of an integrated circuit. A bond pad 504 of the I/O cell 500 may be offset a predetermined distance d. In particular, the bond pad 504 may include a bond pad edge 506 in parallel with and closest to the I/O cell edge 502 that is offset the predetermined distance d.

A dotted line 508 may denote a boundary between a first volume of the I/O cell 500 that includes ESD protection circuitry and a second volume that includes functional circuitry (or if the I/O cell is a power/ground I/O cell, then no active circuitry in the second volume). By offsetting or disposing the bond pad 504 the predetermined distance d away from the I/O cell edge 502, an area defined by and between the I/O cell edge 502 and the bond pad edge 506 may be created where one or more lateral rails may be disposed in metal layers that would otherwise be used for the bond pad 504 if it was not offset by the predetermined distance d. FIG. 5 shows two lateral rails 510, 512 disposed in the area created by the offset, although any number of lateral rails may be included in the area. That number may depend on the predetermined distance d, how many metal layers the bond pad 504 includes, the technology being used which may specify a required width for and spacing between the lateral rails, as well as a desired or predetermined number of power and ground rails to be included in the area which may correspond to desired rail resistance(s). For the configuration shown in FIG. 5, both of the lateral rails 510, 512 may be power rails, both lateral rails 510, 512 may be ground rails, or one of the rails 510, 512 may be a power rail while the other of the rails 510, 512 may be a ground rail. Various configurations are possible.

With one or more lateral rails being disposed in the area due to the offset of the bond pad 504 by the predetermined distance d, the metal layers in which the lateral rails are disposed may be the same as one or more metal layers in which the bond pad 504 is disposed. For example, in a seven layer metal stack, if the bond pad 504 is disposed in metal layers five, six, and seven, one or more lateral rails, such as lateral rails 510, 512, may be disposed in metal layer five, metal layer 6, and/or metal layer 7. Those lateral rails may also be disposed in the volume of the I/O cell that includes the ESD protection circuitry. Also, those lateral rails would not be able to be disposed in those metal layers and in that location near the ESD protection circuitry if the bond pad 504 was not offset by the predetermined distance d.

Also, the one or more lateral rails disposed in the area that would otherwise be occupied by the bond pad 504 may be in addition to one or more other lateral rails disposed above the ESD protection circuitry, such as an ESD diode. For example, suppose an ESD diode is below the third metal layer. In addition, suppose, due to the offset of the bond pad 504, a lateral rail is disposed in the fifth metal layer. Such a lateral rail in the fifth layer would be in addition to one or more other lateral rails disposed in the metal layers in between the ESD diode and the fifth metal layer, such as in the third and/or the fourth metal layers. Without offsetting the bond pad 504, only lateral rails in the third and/or fourth metal layers could be available for discharge of ESD current. However, by offsetting the bond pad 504 the predetermined distance d, one or more other lateral rails may be formed in the fifth, sixth, or seventh metal layers, which in turn may reduce the path resistance of the lateral rails and improve performance of the ESD protection circuitry.

Figure 6:
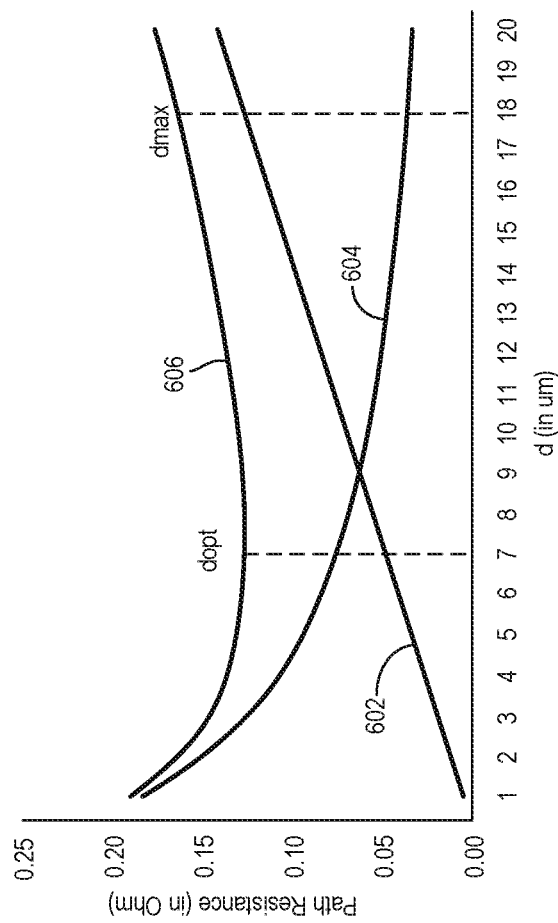
FIG. 6 shows a plot of vertical resistance, lateral resistance, and total resistance of a discharge path as a function of offset distance.

The predetermined distance d that the bond pad edge 506 is offset away from the I/O cell edge 502 may be within a range that yields an improved (reduced) total path resistance. That is, setting the predetermined distance d to be too large may increase the total path resistance to be greater than it would be if the bond pad 504 was not offset at all. FIG. 6 shows a plot of example vertical resistance, lateral resistance, and total resistance of a discharge path as a function of the predetermined distance d. In the plot shown in FIG. 6, curve 602 depicts vertical resistance of vertical rails or other vertical metal connections as a function of the predetermined distance d (vertical resistance may also take into consideration resistance provided by vias), curve 604 depicts lateral resistance of the lateral rails as a function of the predetermined distance d, and curve 606 depicts total resistance (combination of vertical and lateral resistance) as a function of the predetermined distance d.

As shown by the lateral resistance curve 604, as the predetermined distance d increases, the lateral resistance generally decreases because more lateral rails may be included in the area created by the offset. The decrease in resistance may be greater for smaller distance values and the decrease tends to be more gradual for larger distance values.

In addition, as shown by the vertical resistance curve 602, as the predetermined distance d increases, the vertical resistance linearly increases. This may be because vertical metal connections may be used to connect bond pads to ESD diodes (e.g., in FIG. 4, vertical metal connections may be used to connect the first bond pad PAD1(+) to ESD diodes D1 and D2 and the second bond pad PAD2(−) to ESD diodes D3 and D4), and increasing the predetermined distance d may increase the length of the vertical metal connections, which in turn may increase the vertical resistance of the vertical metal connections.

Due to the decreasing lateral resistance and the increasing vertical resistance as the predetermined distance d increases, the total resistance initially decreases and then begins to increase, as shown by the total resistance curve 606. FIG. 6 shows an optimal predetermined distance dopt of about 7 micrometers (um) when the total resistance is at a minimum. FIG. 6 also shows an upper bound of the range for the predetermined distance to be about 18 um. Predetermined distances above 18 um may not provide an improved total resistance—i.e., a total resistance that is greater than if the bond pad 504 was not offset at all.

The above curves 602, 604, 606 are merely exemplary and were generated for a 40 nanometer (nm) gate length integrated circuit technology with a metal stack of six metal layers and with a 4X and 1Z option. Other similar curves may be generated and/or other optimum and maximum predetermined distances dopt and dmax may be determined for other integrated circuit technologies with other numbers of metal layers. Also, a minimum predetermined distance dmin may be 1 um, a minimum distance corresponding to a minimum spacing between metals as identified in the specification of the integrated circuit technology, or a minimum distance for at least one lateral rail to be disposed in between the I/O cell edge 502 and the bond pad edge 506 (FIG. 5). In general, a range between a minimum predetermined distance dmin and a maximum predetermined distance dmax may be set so that offsetting the bond pad 504 a predetermined distance d within that range may create an area for additional lateral rails to be disposed which improves an overall total resistance of an ESD discharge path.

Also, it is noted that increasing the predetermined distance d may result in a length of a bond wire needing to be increased in order to form a connection between the bond pad 504 and the connection pin of the packaging. Increasing the length of the bond pad may undesirably increase timing for signal propagation and/or parasitic inductance of the bond wire. Accordingly, changes in timing and/or parasitic inductance resulting from changes in the length of the bond wires may further be considered when determining a maximum predetermined distance dmax.

Referring back to FIG. 1, any number of the I/O cells 106 may have a bond pad 110 that is offset from the I/O cell edge 108. For example, all of the bond pads 110 may be offset, or less than all of the bond pads 10 may be offset. Also, for some example configurations, the predetermined distance d that the bond pads are offset may be the same for all of the I/O cells 106. For other example configurations, there may be multiple different predetermined distances that different bond pads may be offset. Various configurations are possible.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the embodiments described herein can be used alone or in combination with one another.

We claim:

1. An integrated circuit comprising:
    an input/output (I/O) cell comprising:
        a plurality of metal layers separated by a plurality of dielectric layers;
        an I/O cell edge defining a boundary of the I/O cell;
        a bond pad offset from the I/O cell edge by a predetermined distance;
        a volume defined by the I/O cell edge and the predetermined distance that the bond pad is offset from the I/O cell edge; and
        a rail disposed in the volume and in a same metal layer of the plurality of metal layers as the bond pad.

2. The integrated circuit of claim 1, further comprising an electrostatic discharge (ESD) diode disposed in the volume.

3. The integrated circuit of claim 2, wherein the rail comprises a first rail, and wherein the I/O cell comprises a second rail disposed in the volume and disposed in a different metal layer than the first rail, the different metal layer being in between the ESD diode and the first rail.

4. The integrated circuit of claim 1, wherein the bond pad comprises a bond pad edge corresponding to the I/O cell edge, and wherein the predetermined distance is a distance from the I/O cell edge to the bond pad edge.

5. The integrated circuit of claim 1, wherein the predetermined distance is in a range from 1 micrometer to 18 micrometers.

6. The integrated circuit of claim 1, wherein the rail comprises a first rail, and wherein the I/O cell comprises a second rail disposed in the volume and also in the same metal layer as the bond pad.

7. The integrated circuit of claim 6, wherein the first rail comprises a power rail and the second rail comprises a ground rail.

8. An integrated circuit comprising:
a plurality of metal layers separated by a plurality of dielectric layers;
a first bond pad;
a second bond pad offset from an input/output (I/O) cell edge by a predetermined distance;
an electrostatic discharge (ESD) path extending from the first bond pad to the second bond pad;
a volume defined by the I/O cell edge and the predetermined distance; and
a rail disposed in the volume and forming part of the ESD path, the rail being disposed in a same metal layer of the plurality of metal layers as the second bond pad.

9. The integrated circuit of claim 8, further comprising an electrostatic discharge (ESD) diode disposed in the volume.

10. The integrated circuit of claim 8, wherein the rail comprises a first rail, and wherein the I/O cell comprises a second rail disposed in the volume and in between the ESD diode and the first rail.

11. The integrated circuit of claim 8, wherein the rail comprises a first rail, and wherein the I/O cell comprises a second rail disposed in the volume and also in the same metal layer as the second bond pad.

12. The integrated circuit of claim 8, wherein the second bond pad comprises a bond pad edge corresponding to the I/O cell edge, and wherein the predetermined distance is a distance from the I/O cell edge to the bond pad edge.

13. The integrated circuit of claim 8, wherein the predetermined distance is in a range from 1 micrometer to 18 micrometers.

14. An integrated circuit comprising:
a plurality of metal layers separated by a plurality of dielectric layers;
an input/output (I/O) cell comprising:
a bond pad;
a volume vertically extending a height of the I/O cell, wherein the volume comprises:
electrostatic discharge (ESD) circuitry but not functional circuitry of the I/O cell; and
a rail disposed in a same metal layer of the plurality of metal layers as the bond pad.

15. The integrated circuit of claim 14, wherein the ESD circuitry comprises an ESD diode disposed in the volume.

16. The integrated circuit of claim 15, wherein the rail comprises a first rail, and wherein the I/O cell comprises a second rail disposed in the volume and vertically disposed in between the ESD diode and the first rail.

17. The integrated circuit of claim 14, wherein the rail comprises a first rail, and wherein the I/O cell comprises a second rail disposed in the volume in the same metal layer as the first rail.

18. The integrated circuit of claim 14, wherein the bond pad comprises a bond pad edge corresponding to the I/O cell edge, and wherein the predetermined distance is a distance from the I/O cell edge to the bond pad edge.

* * * * *